(12) United States Patent
Moody et al.

(10) Patent No.: US 11,929,714 B2
(45) Date of Patent: Mar. 12, 2024

(54) LOW POWER RECEIVER AND RELATED CIRCUITS

(71) Applicant: University of Virginia Patent Foundation, Charlottesville, VA (US)

(72) Inventors: Jesse Moody, Charlottesville, VA (US); Anjana Dissanayake, Charlottesville, VA (US); Benton H. Calhoun, Charlottesville, VA (US); Steven M. Bowers, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 295 days.

(21) Appl. No.: 17/595,559

(22) PCT Filed: Jan. 16, 2020

(86) PCT No.: PCT/US2020/013834
§ 371 (c)(1),
(2) Date: Nov. 18, 2021

(87) PCT Pub. No.: WO2020/242540
PCT Pub. Date: Dec. 3, 2020

(65) Prior Publication Data
US 2022/0263472 A1    Aug. 18, 2022

Related U.S. Application Data

(60) Provisional application No. 62/854,361, filed on May 30, 2019.

(51) Int. Cl.
*H03F 1/02* (2006.01)
*H03F 3/19* (2006.01)
*H04B 1/16* (2006.01)

(52) U.S. Cl.
CPC ............. *H03F 1/0222* (2013.01); *H03F 3/19* (2013.01); *H04B 1/16* (2013.01);
(Continued)

(58) Field of Classification Search
CPC . H03D 3/006; H03F 1/0222; H03F 2200/105; H03F 2200/222;
(Continued)

(56) References Cited

U.S. PATENT DOCUMENTS 8,331,885 B1    12/2012  Ben-Ari
9,780,776 B1    10/2017  Golan
(Continued)

FOREIGN PATENT DOCUMENTS

CN    109326722    2/2019
CN    109556711    4/2019
(Continued)

OTHER PUBLICATIONS

PCT International Search Report and Written Opinion, dated Jun. 18, 2020, issued in Application No. PCT/US2020/013834.
(Continued)

*Primary Examiner* — Nguyen T Vo
(74) *Attorney, Agent, or Firm* — Weaver Austin Villeneuve & Sampson LLP

(57) ABSTRACT

Low power radio frequency (RF) receivers and related circuits are described.

31 Claims, 11 Drawing Sheets

(52) U.S. Cl.
CPC .. *H03F 2200/105* (2013.01); *H03F 2200/222* (2013.01); *H03F 2200/451* (2013.01)

(58) Field of Classification Search
CPC ....... H03F 2200/451; H03F 3/19; H04B 1/16; H04B 1/18; H04B 1/30
See application file for complete search history.

(56) References Cited

U.S. PATENT DOCUMENTS

| | | | |
|---|---|---|---|
| 11,743,081 | B2 | 8/2023 | Dissanayake |
| 2009/0304118 | A1 | 12/2009 | Yuanzhu |
| 2018/0212635 | A1* | 7/2018 | Wicaksana .......... H04L 27/0014 |
| 2019/0281548 | A1 | 9/2019 | Kristem et al. |
| 2020/0007088 | A1* | 1/2020 | Ranta ...................... H03F 3/213 |
| 2021/0281451 | A1 | 9/2021 | Dissanayake |

FOREIGN PATENT DOCUMENTS

| | | |
|---|---|---|
| WO | WO 95/30275 | 11/1995 |
| WO | WO-2020242540 A1 | 12/2020 |

OTHER PUBLICATIONS

Bassirian Pouyan et al., "Event-driven wakeup receivers: Applications and design challenges", 2017 IEEE 60th International Midwest Symposium on Circuits and Systems (MWSCAS), IEEE, Aug. 6, 2017 (Aug. 6, 2017), pp. 1324-1327.
Bdiri, et al. "An 868MHz 7.5μW wake-up receiver with -60dBm sensitivity," Journal of Sensors and Sensor Systems, 5, 433-446, 2016, 14 pages.
Dissanayake, et al. "A—108dBm Sensitivity, −28dB SIR, 130nW to 41μW, Digitally Reconfigurable Bit-Level Duty-Cycled Wakeup and Data Receiver," IEEE, 2020, 4 pages.
EP Extended European Search Report dated Sep. 18, 2023, in Application No. EP20813343.9.
EP Partial Supplemental Search Report dated Jun. 14, 2023 in EP Application No. EP20813343.9.
Huang, et al., "A 915 MHz, Ultra-Low Power 2-Tone Transceiver With Enhanced Interference Resilience," IEEE Journal Of Solid-State Circuits, vol. 47, No. 12, Dec. 2012, 11 pages.
Huang X., et al., "A 915MHz Ultra-Low Power Wake-Up Receiver with Scalable Performance and Power Consumption," 2011 Proceedings of the ESSCIRC (ESSCIRC), pp. 543-546.
International Preliminary Report on Patentability dated Dec. 9, 2021, for International Application No. PCT/US2020/013834.
Lee Calvin Yoji et al: "Application of Ring-Amplifiers for Low-Power Wide-Bandwidth Digital Subsampling ADC-PLL", 2019 IEEE International Symposium on Circuits and Systems (ISCAS), IEEE, May 26, 2019, pp. 1-5.
Lee, et al. "A CMOS MedRadio Transceiver With Supply-Modulated Power Saving Technique for an Implantable Brain-Machine Interface System," IEEE Journal Of Solid-State Circuits, vol. 54, No. 6, Jun. 2019, 12 pages.
Mangal, et al. "A 0.42nW 434MHz −79.1dBm Wake-Up Receiver with a Time-Domain Integrator," IEEE International Solid-State Circuits Conference, 2019, 3 pages.
Moody, et al., "A—106dBm 33nW Bit-Level Duty-Cycled Tuned RF Wake-up Receiver," Symposium on VLSI Circuits Digest of Technical Papers, 2019, 2 pages.
Moody Jesse et al: "A—76dBm 7.4nW wakeup radio with automatic offset compensation", 2018 IEEE International Solid-State Circuits Conference( ISSCC), IEEE, Feb. 11, 2018, pp. 452-454.
Seok, et al., "A 2.4GHZ, −102dBm-Sensitivity, 25kb/s, 0.466mW Interference Resistant BFSK Multi-Channel Sliding-IF ULP Receiver," Symposium on VLSI Circuits Digest of Technical Papers, 2017, 2 pages.
U.S. Non-Final Office Action dated Nov. 9, 2022 in U.S. Appl. No. 17/249,187.
U.S. Notice of Allowance dated Apr. 12, 2023 in U.S. Appl. No. 17/249,187.
Wang, et al. "A 6.1-nW Wake-Up Receiver Achieving −80.5-dBm Sensitivity Via a Passive Pseudo-Balun Envelope Detector," IEEE Solid-State Circuits Letters, vol. 1, No. 5, May 2018, 4 pages.

\* cited by examiner

| | This Work | | [1] | [2] | [3] | [4] | ISSCC'16 |
|---|---|---|---|---|---|---|---|
| | LPHS | LLHS / LPLL | | | | | |
| Technology | 65 nm | 65 nm | 130 nm | 65 nm | 65 nm | 65 nm | 65 nm |
| Carrier Frequency | 428.3 MHz | | 151.8 MHz | 2.4 GHz | 2.4 GHz | 2.4 GHz | 2.4 GHz |
| Sensitivity | −106 dBm | −106 dBm / −103 dBm | −76 dBm | −80 dBm | −102.5 dBm | −80.5 dBm | −56.5 dBm |
| Power Consumption | 33 nW | 288 nW / 161 nW | 7.4 nW | 4.5 nW | 378 µW | 6.1 nW | 236 nW |
| Latency/Data Rate | 5 s | 240 ms / 240 ms | 92.5 ms | 180 ms | 1 kbps | 180 ms | 12.8 ms |
| Interferer Rejection | AGOC/MEMS | | Offset Comp | N/A | N/A | N/A | N/A |
| CIR @ 3MHz Offset | −16 dB | | −30 dB | N/A | −14 dB | N/A | N/A |
| Die Area | 3.95 mm² | | 1.95 mm² | 4 mm² * | 2.25 mm² * | 6 mm² * | 1.1 mm² * |

* Measured at 99.7% Probability of detection

FIG. 6

LOW POWER RECEIVER AND RELATED CIRCUITS

STATEMENT OF GOVERNMENT INTEREST

This invention was made with government support under Grant No. HR0011-15-C-0139 awarded by DARPA. The government has certain rights in the invention.

INCORPORATION BY REFERENCE

Each application to which this application claims benefit or priority as identified in the concurrently filed PCT Request or Application Data Sheet is incorporated by reference herein in its entirety and for all purposes.

BACKGROUND

Radio frequency (RF) wakeup receivers are used in a wide variety of applications to trigger operation of associated circuits and devices. Such applications include, for example, wireless sensor networks in which sensor nodes are normally powered down or in low power states to preserve power. Such circuits and devices are powered up in response to detection of an RF wakeup signal or code by the wakeup receiver. Because at least a portion of a wakeup receiver must always or frequently be on to "listen" for wakeup signals, it is important that the receiver consume very little power while having an appropriate level of sensitivity for detection of the wakeup signal. This is particularly true for sensor networks embedded in remote or inaccessible areas and for which the power level of the wakeup signal may be very low. Near-zero-power wakeup receivers can significantly increase the operational lifetime of sensor nodes in such applications.

SUMMARY

According to a particular class of implementations, a radio frequency (RF) receiver includes an RF gain stage configured to amplify an RF signal. The RF signal is characterized by a bit duration. An envelope detector follows the RF gain stage. Baseband circuitry follows the envelope detector. The baseband circuitry is configured to detect a modulating signal transmitted with the RF signal. Enable circuitry is configured to enable the RF gain stage to sample the RF signal using a sampling duration. The sampling duration is configurable down to less than 10% of the bit duration.

According to a specific implementation of this class, the RF gain stage includes a regenerative ring amplifier. The regenerative ring amplifier employs feedback that does not include inductive components. According to a more specific implementation, the feedback includes a tunable capacitor configured to maintain operation of the regenerative ring amplifier near an instability point. According to an even more specific implementation, the tunable capacitor is fixed during operation of the RF receiver. According to an alternative specific implementation, the tunable capacitor is dynamically tunable during operation of the RF receiver. According to an even more specific implementation, the tunable capacitor is dynamically tunable during the sampling duration.

According to another specific implementation of this class, an auxiliary receiver circuitry is configured to receive the RF signal and to adjust one or more parameters of the RF receiver in response to detection of RF interference. According to a more specific implementation, the auxiliary receiver circuitry includes a second RF gain stage and a second envelope detector preceding the second RF gain stage.

According to another specific implementation of this class, the RF receiver includes a high-Q filter following the RF gain stage and preceding the envelope detector. According to a more specific implementation, the high-Q filter includes a micro-electromechanical component. According to another more specific implementation, the RF gain stage, the envelope detector, and the enable circuitry are implemented in one or more integrated circuits, and the high-Q filter is implemented with one or more discrete components separate from the one or more integrated circuits.

According to another specific implementation of this class, the enable circuitry is also configured to enable the baseband circuitry before enabling the RF gain stage. According to a more specific implementation, the enable circuitry is configured to enable different parts of the baseband circuitry at different times.

According to another specific implementation of this class, the RF receiver includes a high-Q filter preceding the RF gain stage.

According to another specific implementation of this class, the RF receiver includes an impedance matching network preceding the RF gain stage.

According to another specific implementation of this class, the enable circuitry is configured to enable the RF gain stage to sample the RF signal multiple times during the bit duration.

According to another specific implementation of this class, the sampling duration is configurable down to less than 1% of the bit duration.

According to another specific implementation of this class, the envelope detector is a triode-mode envelope detector. According to a more specific implementation, the triode-mode envelope detector includes a plurality of N-type transistors and a plurality of P-type transistors. The N-type transistors and P-type transistors are configured in a plurality of stages. Each stage includes an N-type transistor and a P-type transistor connected to each other at corresponding source terminals and capacitively coupled to ground at corresponding drain terminals. The N-type transistor in each stage includes a gate terminal configured to receive a first bias voltage. the P-type transistor in each stage includes a gate terminal configured to receive a second bias voltage. The connected source terminals of each stage are configured to receive a radio frequency (RF) input signal. The first bias voltage controls a channel impedance for each of the N-type transistors, and the second bias voltage controls a channel impedance for each of the P-type transistors.

According to another specific implementation of this class, the RF receiver includes control circuitry configured to control gain of one or more gain components of the baseband circuitry and to control a dynamic range associated with one or more detection components of the baseband circuitry. According to a more specific implementation, the one or more detection components of the baseband circuitry include a first comparator configured to detect bits transmitted with the RF signal, and wherein the control circuitry is configured to control the dynamic range by adjusting a comparator threshold associated with the first comparator. According to an even more specific implementation, the one or more detection components of the baseband circuitry include a second comparator and a third comparator. The second and third comparator are configured to generate range signals representing an amplified signal level of the envelope detector in relation to the dynamic range. The control circuitry is configured to control the dynamic range based on the range signals. According to another more specific implementation, the one or more detection components of the baseband circuitry include an analog-to-digital converter (ADC) configured to detect bits transmitted with the RF signal.

According to another specific implementation of this class, the modulating signal transmitted with the RF signal is represented by a sequence of bits. Each bit is represented using a first tone at a first frequency and a second tone at a second frequency. The baseband circuitry includes a bandpass filter configured to reject interfering signals.

According to another specific implementation of this class, the modulating signal transmitted with the RF signal is represented by a sequence of bits. Each bit is represented using a reference tone at a reference frequency and either a first tone at a first frequency or a second tone at a second frequency. The first and second tones are used alternately in conjunction with the reference tone to represent successive bits. The baseband circuitry includes a bandpass filter configured to reject interfering signals. According to a more specific implementation, the baseband circuitry is configured to detect the sequence of bits without a local oscillator.

According to another class of implementations, an envelope detector includes a plurality of N-type transistors and a plurality of P-type transistors. The N-type transistors and P-type transistors are configured in a plurality of stages. Each stage including an N-type transistor and a P-type transistor connected to each other at corresponding source terminals and capacitively coupled to ground at corresponding drain terminals. The N-type transistor in each stage includes a gate terminal configured to receive a first bias voltage. The P-type transistor in each stage includes a gate terminal configured to receive a second bias voltage. The connected source terminals of each stage are configured to receive a radio frequency (RF) input signal. The first bias voltage controls a channel impedance for each of the N-type transistors, and the second bias voltage controls a channel impedance for each of the P-type transistors.

According to a specific implementation of this class, the first and second bias voltages are fixed during operation of the envelope detector.

According to another specific implementation of this class, the first and second bias voltages are dynamically controllable during operation of the envelope detector. According to a more specific implementation, the first and second bias voltages are dynamically controllable in response to one or more of temperature, RF interference, matching network impedance, or antenna impedance. According to an even more specific implementation, the first and second bias voltages are dynamically controllable using a lookup table stored in memory associated with the envelope detector.

A further understanding of the nature and advantages of various implementations may be realized by reference to the remaining portions of the specification and the drawings.

BRIEF DESCRIPTION OF THE DRAWINGS

FIG. 6 is a table illustrating performance characteristics of specific implementations.

DETAILED DESCRIPTION

Reference will now be made in detail to specific implementations. Examples of these implementations are illustrated in the accompanying drawings. It should be noted that these examples are described for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations. Some implementations within the scope of this disclosure may be practiced without some or all of these details. Further, well known features may not have been described in detail for the sake of clarity.

According to various implementations described herein, ultra-low power receivers are described, at least some of which embody techniques, methods, circuits, and components that are themselves novel and/or may be used in other contexts. One class of implementations includes wakeup receivers that represent a significant improvement over conventional wakeup receivers. However, receivers enabled by the present disclosure may be employed in other contexts including, for example, as data receivers, or as receivers of non-wakeup messages in low power modes. It should also be noted that implementations enabled by the present disclosure may be used in a wide variety of application including, but not limited to, defense applications (e.g., perimeter monitoring, persistent sensing), industrial applications (e.g., motor monitoring, equipment monitoring), agricultural applications (e.g., crop monitoring, livestock monitoring), health applications (e.g., wireless patient monitoring), etc. References herein to specific applications should therefore not be used to limit the scope of this disclosure or the claims.

Figure 1:
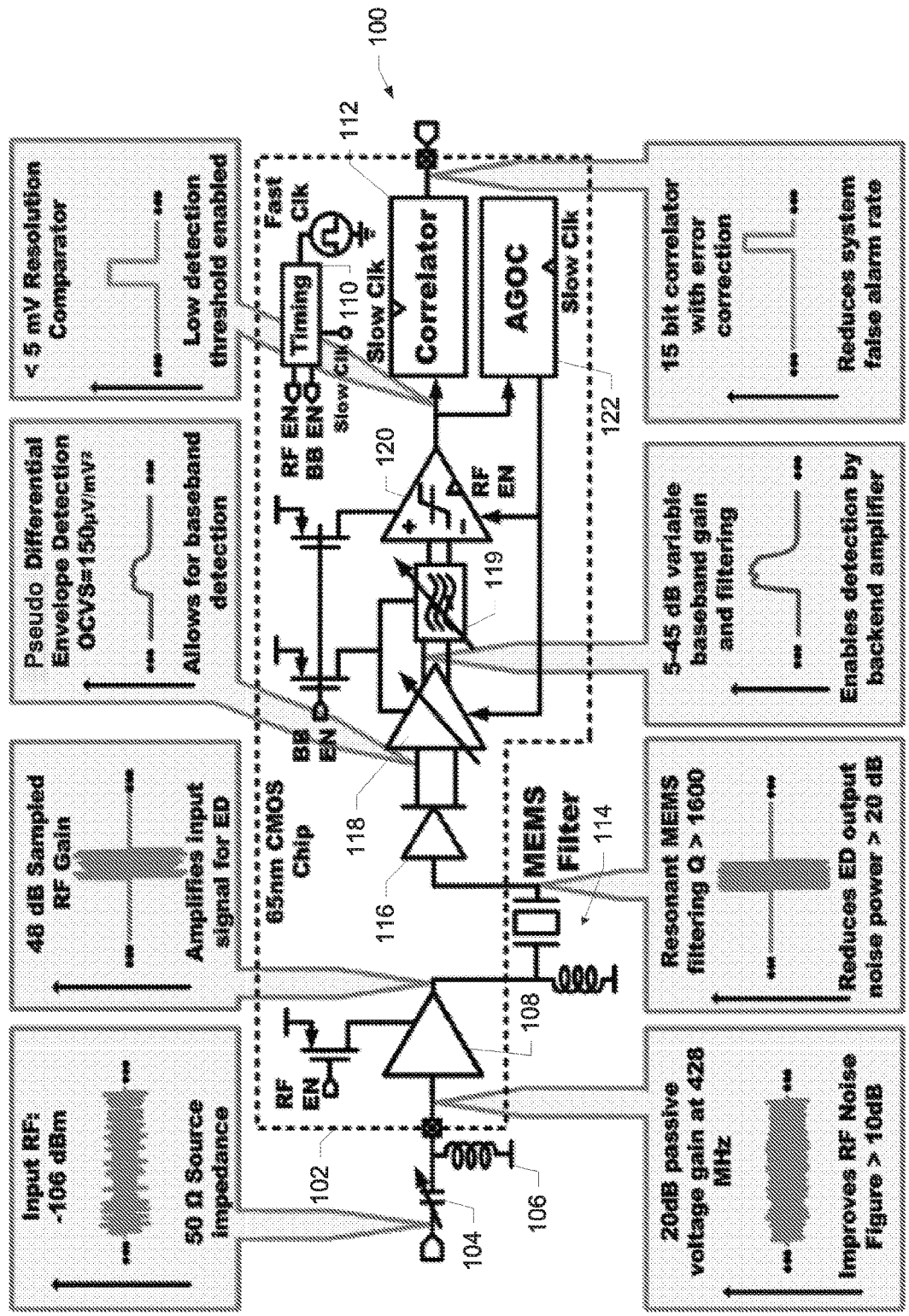
FIG. 1 is a simplified schematic diagram of a receiver designed according to a particular class of implementations.

FIG. 1 is a high-level schematic diagram of a receiver 100 implemented according to a particular class of implementations. Circuitry included in an integrated circuit manufactured using a 65 nm CMOS process is included within dashed line 102. External discrete components are shown outside the dashed line. As will be discussed, enablement of the operation of different portions of the receiver may be staggered such that each is only on when it is needed.

An impedance matching network at the RF input includes a tunable capacitor 104 and an inductor 106, transitioning received RF input signals from a 50 ohm source impedance typical in RF applications to a higher impedance environment. The transition to a higher impedance environment is intended to ensure sufficiently high voltages for the on-chip circuitry. In the depicted example, the power level of the input RF signal is −106 dBm and the impedance matching network achieves a 20 dB passive gain at 428 MHz. As will be appreciated, these are merely numerical examples for illustrating the operation of the specific implementation depicted.

RF amplifier 108 is turned on and off using the RF EN signal. As will be discussed, the ability to perform duty cycling of RF amplifier 108 is important to the ultra-low-power nature of receiver 100. According to various implementations, duty cycling of RF amp 108 is at the bit level meaning that, for every transmitted bit of an RF signal (e.g., a wakeup signal) the RF amplifier cycles on and off multiple times within the bit; somewhat analogous to a sampling A/D converter. According to some implementations, the percentage of the bit duration captured by this duty cycling is be tunable from 0.01% up to 100%. This is to be contrasted with previous receiver designs employing heterodyne architectures in which the startup time of the phase-locked loop circuit severely constrained the minimum achievable duty cycle and therefore the minimum achievable power.

In order to maintain very low power, the RF gain stage (including RF amp 108) may be kept off most of the time. Timing block 110 provides independent control of the enable signals for the RF circuitry and the baseband circuitry using the RF EN and BB EN enable signals, respectively. This allows for the activation of these different parts of receiver 100 to be staggered such that each is only on as long as it is needed. This may be understood with reference to the illustration of FIG. 2.

The upper trace in the figure represents the RF input signal to receiver 100 which is depicted along a timeline and is characterized by a TX ON period during which a bit is being transmitted by a remote transmitter (not shown), and a TX OFF period during which the remote transmitter is not transmitting. In the depicted example, different periods of power consumption by receiver 100 are represented in the lower trace by different blocks along the same timeline. Blocks 202 represent periods in which power is consumed by only the very low-power parts of receiver 100 (e.g., the digital backend) that are always on, e.g., the fast clock that runs timing block 110, timing block 110 itself, correlator 112 (which includes stored data), etc. Blocks 204 represent periods in which power is consumed by the always-on components and baseband circuitry that is enabled by the BB EN signal. The baseband circuitry takes time to settle when turned on but consumes less power than the RF circuitry so can be turned on longer, giving it time to settle. Blocks 206 represent periods when all of the different portions of receiver 100 (including the RF circuitry and RF amp 108) are consuming power. As illustrated in the figure, blocks 206 correspond to a relatively small (and tunable) portion of the TX ON period of the RF input. This approach allows for considerably flexibility in duty cycling the fast startup RF components of the receiver.

Figure 2:
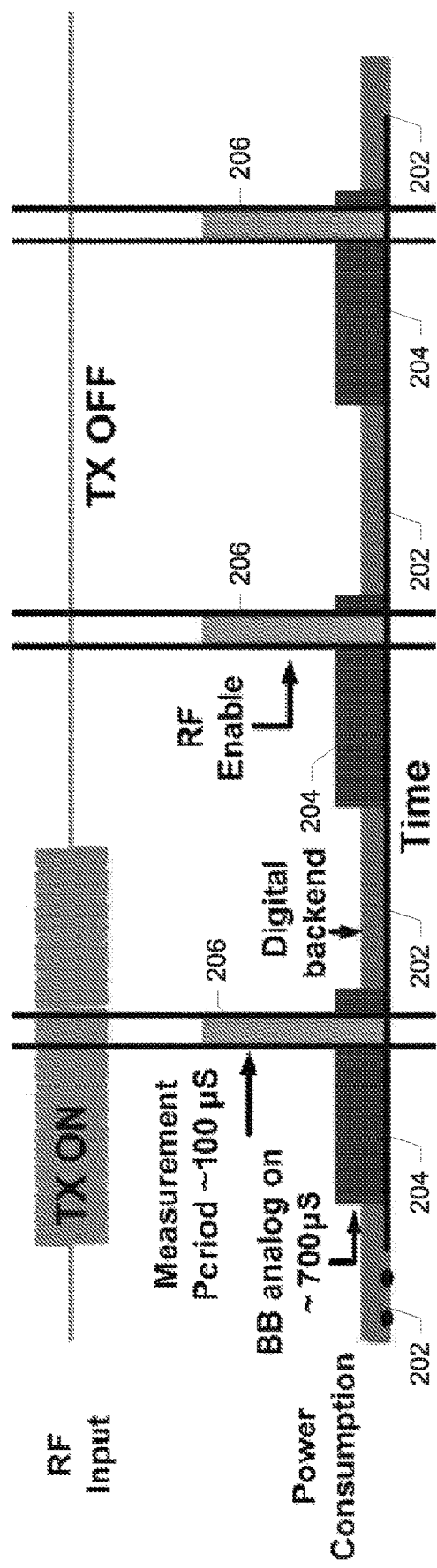
FIG. 2 is a timing diagram illustrating staggered turn-on for various portions of a receiver according to a particular implementation.

It should be noted that FIG. 2 is a simplified representation for illustrative purposes only and is not shown to scale. For example, as mentioned above, the total on time of the RF circuitry may be as little as 0.01% of the bit duration of the RF input signal and so would represent a much smaller portion of the TX ON duration than depicted. In fact, the on time may be even lower than 0.01%, although gains may be diminished beyond this point. In another example, there might be multiple repetitions of blocks 204 and 206 within the depicted bit duration. In another example, there might be multiple on/off cycles of the RF circuitry within each block 206. Sampling the RF signal multiple times per bit duration may have one or more advantages. For example, if a received bit is in transition at the sample time, this can lead to missed detections. Sampling multiple times per bit means that at least one sample will avoid the bit transition. In addition, if the probability of missed detection is X, sampling twice should reduce that probability to $X^2$ to the first order (e.g., the probability is reduced from 0.01 to 0.0001). On the other hand, multiple samples per bit will increase power consumption, so an appropriate balance may need to be achieved for each specific application.

In another example, providing power to receiver components in a staggered way may be more complex with additional portions of the receiver having their own dedicated startup times and periods during which power is supplied. For example, bias can be provided to at least some of the RF circuitry after the baseband and/or IF circuitry is enabled but prior to the TX ON period. In addition, a dedicated enable and on time period can be provided for the analog-to-digital converter (ADC) for implementations employing an ADC as described below. More generally, the present disclosure enables aggressive per-block-optimized duty cycling of the various blocks of the receiver to realize very short RF sampling times and/or lower average power relative to implementations that employ a single startup of the RF and baseband paths. The scope of this disclosure and the claims should therefore not be limited by reference to the foregoing examples.

Referring again to FIG. 1, off-chip noise filtering is done using a very sharp MEMS filter 114 (e.g., Q>1600). This results in a significant reduction of the noise power in the output of envelope detector 116. It should be noted that any of a variety of active or passive high-Q filters with similar characteristics may be used.

Envelope detector 116 converts the RF input signal to the baseband, also converting the single-ended RF signal to a pseudo-differential baseband signal. The term "pseudo" is used because the baseband signal is not necessarily "differential" in the classical sense. However, the signals move in opposite directions so taking the difference between the two allows for greater accuracy in detection. At the baseband, gain can be obtained more efficiently from a power perspective so envelope detector 116 is followed by various gain stages operating in the baseband (118), as well as some additional filtering to remove out of band noise and interference (119). Comparator 120 digitizes the resulting baseband signal. An automatic gain and offset control (AGOC) block 122 sets the baseband circuitry gain and the threshold voltage(s) for comparator 120 for optimal detection without the need of external calibration signals. Additional details regarding the operation of a specific implementation of a suitable AGOC block are provided below.

In the depicted implementation, the last block in the chain is correlator 112 which is implemented with error tolerance to minimize false code detections and supports a large number of addressable nodes. The error tolerance allows the decision threshold to be placed within the noise of the signal, decreasing the minimum detectable signal, but also potentially leading to false positives on a bit-wise basis. By using the correlation with error tolerance, false positives are rejected without missing a code, or falsely detecting a code. According to one such implementation, the code in the RF input signal is a multi-bit code and correlator 112 is a 15-bit correlator that receives the comparator output and determines how close the sequence of bits at the comparator output is to the expected code. Another implementation employs a 31-bit correlator. If the received sequence of bits is sufficiently close to the code, correlator 112 generates a corresponding command As mentioned above, the command might be a wakeup command transmitted to the circuitry of a sensor node of which receiver 100 is a part.

Figure 3:
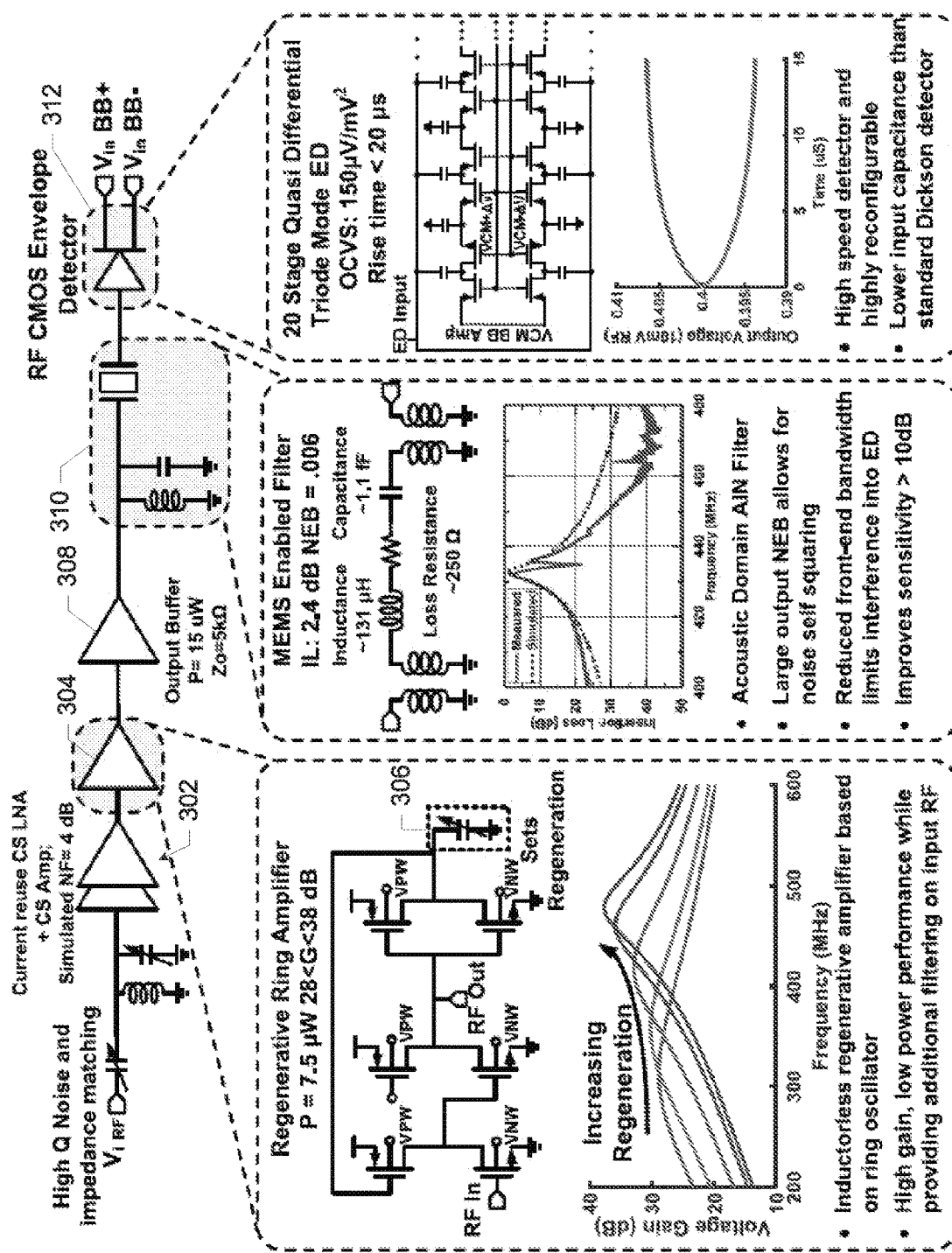
FIG. 3 is a simplified diagram of an RF front end for receiver according to a particular implementation.

FIG. 3 illustrates an example of RF front end circuitry suitable for use with various implementations enabled by the present disclosure (e.g., receiver 100). The RF front-end (FIG. 3) achieves a low noise figure (e.g., about 5 dB) by co-designing the resistive feedback current reuse common source low-noise amplifier with a high-Q off-chip impedance/noise matching network, and efficient gain using an inductorless regenerative ring amplifier.

Two low noise amplifier (LNA) stages 302 are good implementations of a standard topology and are important for getting an initial bit of gain with low noise. Following LNA stages 302, a large amount of gain (e.g., 28-38 dB) is achieved using a regenerative ring amplifier 304. According to a specific implementation, this gain is achieved with only about 7.5 microwatts of power because of the manner in which the feedback in the regenerative ring amplifier is implemented. According to the depicted implementation, this feedback is tuned using a tunable capacitor 306 to keep ring amplifier 304 on the verge of instability, i.e., at or near the point at which the highest gain can be achieved for a given DC power input without the amplifier going unstable. Tunable cap 306 is set with a digitally programmable input to push amplifier 304 as close to the edge of instability as possible, backing off at the first signs of instability. According to even more specific implementations, this value can be set when the receiver is deployed and left there, or can be set dynamically during operation of the receiver, e.g., each RF enable period.

One of the advantages of regenerative ring amplifier 304 from a power perspective is that it does not include inductors that would otherwise drive power consumption up substantially. By contrast, previous generations of "low power" regenerative amplifiers are based on LC oscillators that rely on inductors in combination with capacitors to provide regenerative gain. The low inherent Q-factor of the passive LC components of such designs necessitates much higher power consumption compared to the depicted design. Our feedback capacitor allows us to tune the ring amplifier and set the regeneration without the power disadvantages associated with the use of inductors. And it should be noted that the fact that the tunability of the feedback capacitor is not fundamental to the design. That is, implementations are contemplated in which a fixed capacitor is used to configure the ring amplifier at or near the edge of stable operation. It should also be noted that implementations are contemplated that employ either a tunable or fixed resistor in combination with a fixed capacitor to achieve such an operating point.

Referring again to FIG. 3, output buffer 308 drives off-chip MEMS filter 310. And while it may be conventional to drive a filter with a buffer, it will be appreciated that it is not common to use a filter at this point in a receiver chain. Typically, filters are placed at the RF input to block out-of-band interference and, as a consequence, result in a very wide noise bandwidth at the output stage which can severely limit the receiver's sensitivity, particularly for very low power applications (e.g., microwatts and below). By contrast, placing a very high-Q filter after the broadband and very noisy gain stages as depicted in FIG. 3 results in substantially better sensitivity than other tuned RF architectures. For example, the depicted implementation results in a noise bandwidth reduction at the output that is on the order of a 20 dB better performance than other receiver designs.

According to a specific implementation, the filter is a high impedance (e.g., 5 kΩ) aluminum nitride MEMS filter that reduces the RF output noise equivalent bandwidth to <1 MHz, decreasing detector output noise through mitigating the noise self-squaring effect. It should be noted that implementations are contemplated in which filtering is placed both before and after the RF amplification stage.

The filtered signal goes from MEMS filter 310 back on chip to envelope detector 312. According to a specific implementation and as shown in FIG. 3, envelope detector 312 is a triode-mode detector that improves tunability and speed over conventional envelope detectors without contributing flicker noise at baseband. This is to be distinguished from a conventional Dickson envelope detector in which the transistors are diode-connected, i.e., the drains of the devices are connected to their gates making each transistor act more like a diode. By contrast, in envelope detector 312 the transistors are configured for subthreshold operation and are driven at the sources only with the drains connected to ground and the gates being independently driven. As will be appreciated, this it should be noted that this source-only injection represents significant advantages over other modified Dickson-style detectors.

Subthreshold operation can be described as operating one or more field-effect transistors (FETs) in a weak-inversion mode where a gate-to-source voltage is established at or below a threshold voltage ($V_t$) for the one or more FETs. This results in a primarily exponential dependence on drain-to-source current as a function of gate-to-source voltage.

We discovered that the conventional gate-to-drain connection is not necessary for transistors configured for subthreshold operation because the conventional diode connection is not necessary for rectification and RF detection. This allows for use of the gates to set biasing points for their corresponding transistors, thus providing tunability of the channel conductance for each transistor. This allows for a design tradeoff between the input voltage and the output noise of the envelope detector. This flexibility allows for the design of the envelope detector to match the MEMS filter, as well as to improving the signal-to-noise ratio at the output of the envelope detector. Additional details regarding a particular implementation of a triode-mode envelope detector suitable for use with implementations enabled by the present disclosure are provided below. It should be noted that, despite the superior performance represented by triode-mode envelope detectors enabled by the present disclosure, implementations are contemplated in which conventional envelope detectors (e.g., diode-connected Dickson envelope detectors) are used to implement low-power RF receivers.

Figure 4:
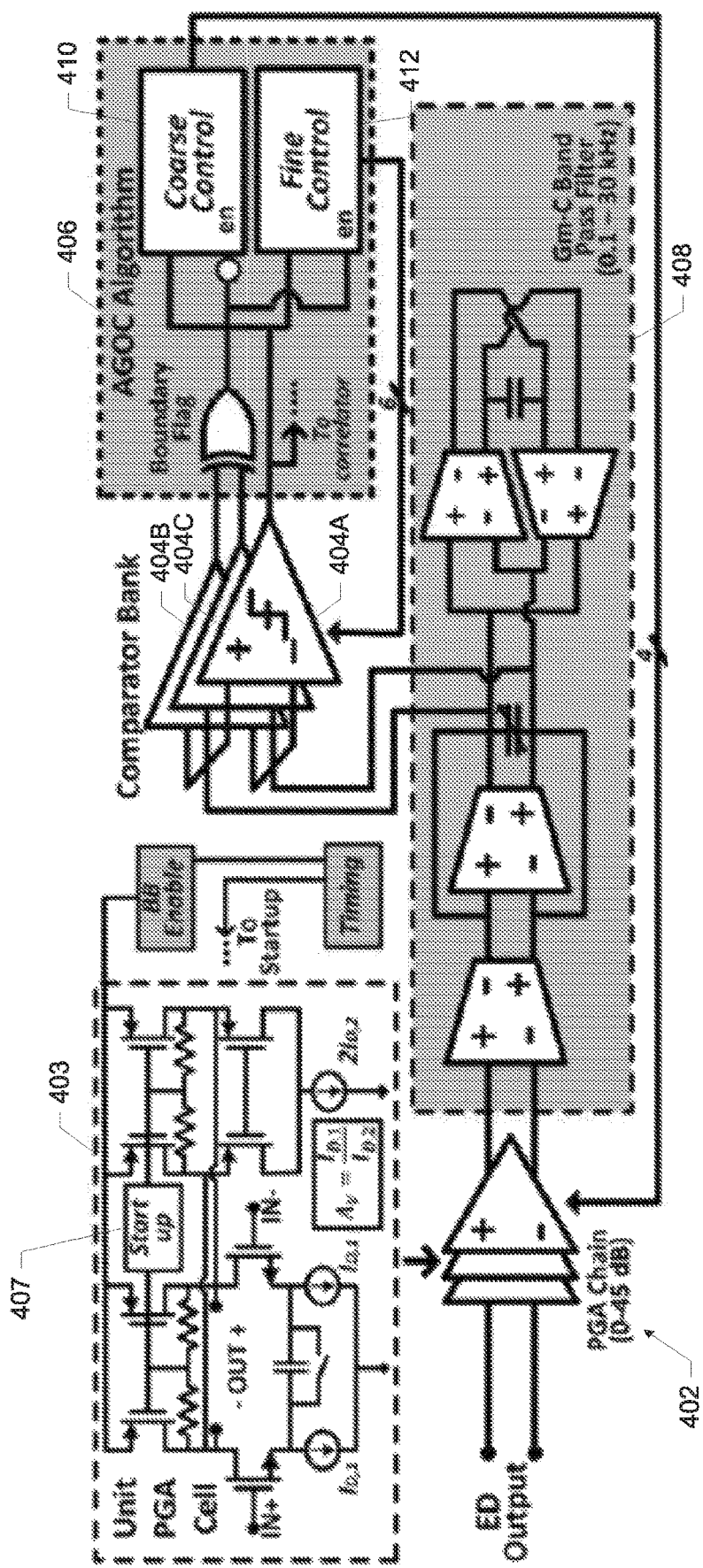
FIG. 4 is a simplified diagram of baseband circuitry for receiver according to a particular implementation.

FIG. 4 illustrates an example of baseband circuitry suitable for use with various implementations enabled by the present disclosure (e.g., receiver 100). In the depicted example, the baseband circuitry receives the output of an envelope detector (e.g., detector 116 or 312) which has converted a received signal from an RF band to a baseband signal that is many orders of magnitude lower in frequency. In the baseband, suitable gains can be achieved for nanowatts of power. The output of the envelope detector is received by a programmable gain amplifier (PGA) chain 402 in which various gain stages can be enabled or disabled to achieve gains from 0 dB to 45 dB. This range of gain allows for a sufficient and consistent signal level at a bank of comparators 404A-404C despite considerable variation at the input. As will be described, the gain of PGA chain 402 is controlled by an automatic gain and offset (AGOC) block 406.

According to a particular implementation, each cell 403 in PGA chain 402 is a CMOS circuit that is characterized by highly linear, variable baseband gain at very low power levels that is achieved by exploiting the exponential nature of subthreshold saturation mode circuits. The main amplifier is on the left hand side of cell 403 with a similar circuit on the right hand side. Because the circuits are operating in subthreshold mode, the gain is proportional only to the bias currents of the two branches, i.e., $A_v=I_{D,1}/I_{D,2}$. That is, during normal operation, the current in a transistor increases quadratically with the gate voltage. By contrast, during subthreshold operation, the relationship is exponential. The exponentially changing current interacts with the logarithmically changing impedance of the diode load to produce a linear voltage, thus resulting in a highly linear and tightly controlled gain.

As discussed herein, instead of turning receiver circuitry on for an entire data word or packet, this circuitry may be turned on and off multiple times within each bit. Reducing the startup time in such implementations is therefore important because the startup time is time during which data can't yet be received. Therefore, according to a specific implementation, startup block 407 in the unit PGA cell of FIG. 4 temporarily grounds the transistor gates to which it is connected, quickly charging the gates up. That is, under normal operations startup 407 represents what is effectively an open circuit. The bias resistors for the transistors are very large for performance reasons, but with the parasitic capacitances of the circuit they present a very large RC constant which takes a long time to charge. By shorting these nodes to ground, the bias resistors are temporarily taken out of the circuit, bringing the RC constants to near zero. This reduces the startup time to about 100 microseconds rather than what would otherwise be tens of milliseconds.

Gm-C bandpass filter 408 rejects noise generated by the baseband circuitry. Gm is a transconductance that receives a voltage input and produces a current output that flows through a capacitance C, the combination of which (Gm and C) set the band for the filter. Gm-C filter 408 relies on active components to synthesize inductance in order to construct active filters with capacitors. As illustrated, the band may be tunable with one or more adjustable capacitors. According to a particular implementation, filter 408 is a $2^{nd}$ order bandpass filter (tunable 1-10 kHz bandwidth) that processes the IF signal before its digitized by comparator 404A with a 6-bit binary-weighted programmable threshold. It should be noted however that other on-chip filter techniques (e.g., bi-quadratic filters) can be used. And as will be discussed, PGA chain 402 and comparator 404A are digitally controlled by an automatic gain and offset control block to determine the appropriate detection threshold voltage.

The filtered signal from filter 408 is received by comparators 404A-C which, in this example, include three comparators; one (404A) for the detection of incoming code bits, and two (404B and 404C) that are used to determine whether the data detection threshold needs to be adjusted. For example, if there is a range of thresholds for comparator 404A (e.g., a normalized range of 0 to 1), the threshold can be set anywhere in that range. However, circumstance may arise (e.g., the presence of an interfering signal) in which it would be desirable for the threshold to be outside of that range. Under such circumstances, comparators 404B and 404C set a "boundary flag" input to AGOC block 406. This supports quick detection of situations in which changes are needed in the gain of PGA chain 402 (via coarse control block 410) and/or the detection threshold for comparator 404A (via fine control block 412), thus helping AGOC block converge to new levels quickly. For example, if there is a large source of interference nearby, the boundary flag comparators would detect that condition, with the AGOC block lowering the baseband gain and correspondingly adjusting the detection threshold so that the comparators can continue to handle the incoming signal levels. As will be understood, this may results in some loss of sensitivity, but the receiver remains functional. As will be discussed, this detection function may also be done with an analog-to-digital converter.

Figure 5:
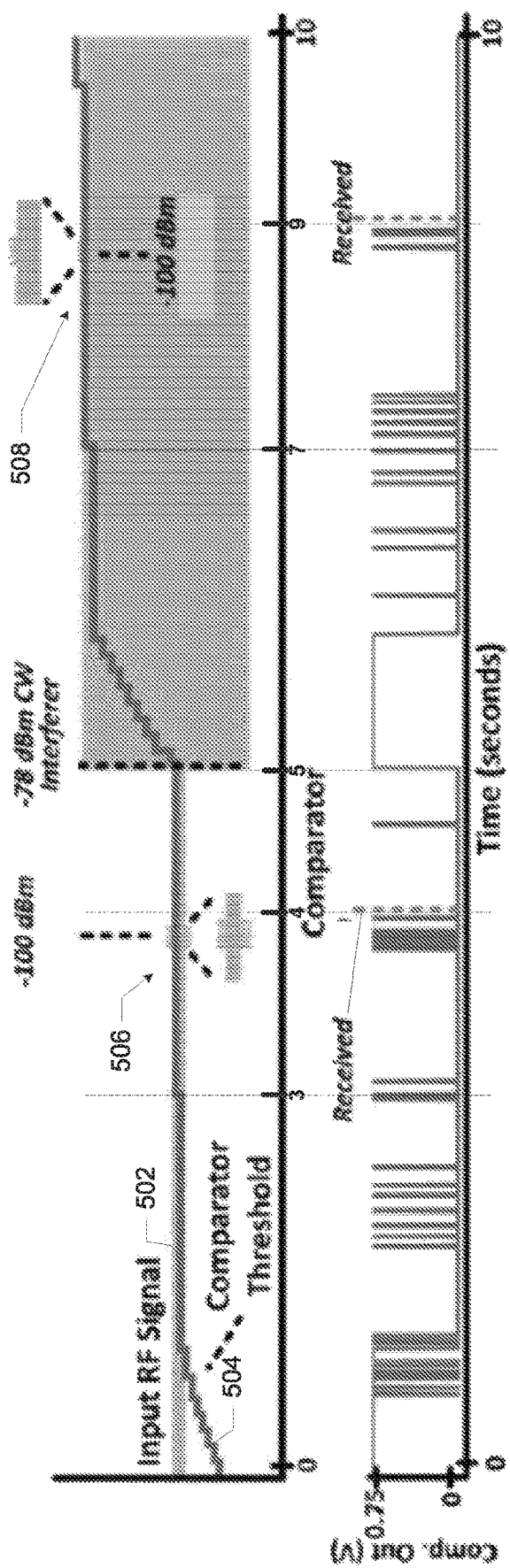
FIG. 5 is a timing diagram illustrating operation of a receiver in the presence of interference according to a particular implementation.

FIG. 5 illustrates an example of the operation of an AGOC block according to a particular implementation. The top graph represents an RF input signal 502 in relation to a comparator detection threshold 504. The bottom graph shows the comparator output. Starting at time t=0, the AGOC block brings comparator threshold 504 in line with the signal level of input signal 502 by incrementing the threshold (e.g., via fine control block 412) until it is at or above the RF signal level at t=3. At t=4, the comparator output is recognized (e.g., by the correlator) as a received code (based on received bits 506 at −100 dBm).

At t=5, a source of interference is encountered that, at −78 dBm, is 22 dB larger in amplitude than the previously received −100 dBm code. In response to this (as indicated by the boundary flag), the AGOC block adjusts both the gain of the PGA gain block and the comparator threshold so that the comparator threshold is at or above the RF signal level at t=7. Thus, when a subsequent code is received, even in the presence of the interfering signal, bits 508 of the code (also at −100 dBm) cross the comparator threshold resulting in recognition of the received code at t=9.

Comparator 404A of FIG. 4 receives an analog input and generates either a 1 or a 0, and AGOC 406 adjusts the thresholds and gains based on previous comparisons that have been made. According to an alternative implementation, instead of a comparator (which only provides 1 bit of information), a successive approximation register (SAR) analog-to-digital converter (ADC) may be used to generate a digital code output. Using this approach, the output of the SAR ADC can represent the degree to which the input exceeds the threshold. This, in turn, allows for the automatic calibration to converge much faster. The decision is still a bit decision at the output, but the information regarding how close the input is to the threshold is used for the calibration. The sampling and processing required to achieve this may be done during the relatively large amount of time when the incoming signal is not being sampled.

According to some implementations, rapid convergence of the front-end decision voltage is achieved through means of an ADC-based monitoring circuit to adjust gain when the signal level leaves the ADC full range. According to a specific implementation, a 6-bit differential SAR ADC quantize the baseband output signal during the RF sampling period. The ADC result is compared against a target threshold to generate a bit decision. The AGOC algorithm dynamically adjusts the baseband and IF gain to keep the threshold level within a subset of the ADC's range. The decision threshold is tuned slowly during periods with low quantities of false positives. By contrast, under high interference conditions, the decision threshold can be rapidly adjusted based on monitoring of the 6-bit ADC code and directly jumping to a new threshold based on the ADC value. As will be appreciated, making a similar transition based on a 1-bit ADC value (e.g., a comparator output) will typically take longer.

In the case of FIG. 4, there are three comparators; one in which the threshold is all the way up, one in which the threshold is all the way down, and one for which the threshold is tuned. This allows for the determination as to whether the input voltage is outside of the range of the comparator threshold, thereby setting the boundary flag, and resulting in an increase or decrease of the gain of the programmable gain amplifier.

Implementations are also contemplated in which, rather than wait until the threshold of the comparator is incremented to its maximum, the maximum and minimum can be checked. That is, one of the three comparators is used for the actual determination of a 1 or 0. A second is used to set to the maximum threshold, i.e., if this comparator trips, then the gain is too high. The third is used set to the minimum threshold, i.e., if this comparator is not tripped, the gain is too low. A similar approach may be taken for the SAR ADC implementation, and can be generalized to any level detection use case.

The sequence of bits that are detected by the comparator are provided as input to a correlator (e.g., correlator 112 of FIG. 1). According to a particular implementation, the correlator is a 15-bit correlator that determines how close the received sequence of bits is to the expected code. According to another implementation, the correlator is a 31-bit correlator with five bits of programmable error tolerance. Effectively, the correlator puts the received sequence into a shift register and compares the received sequence bit wise to the expected code. The correlator adds up all the errors and, if the errors are less than some threshold, it generates a signal to the addressable nodes of the associated circuitry. Otherwise the associated circuitry remains in its sleep or low-power mode.

Figure 7:
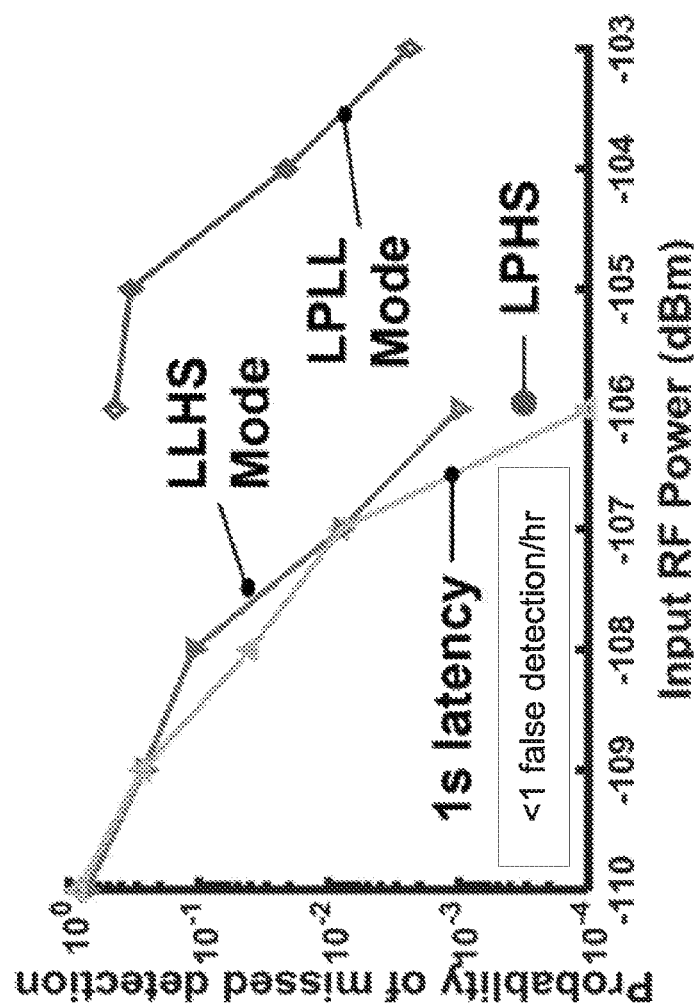
FIG. 7 is a graph illustrating performance characteristics of specific implementations.
Figure 8:
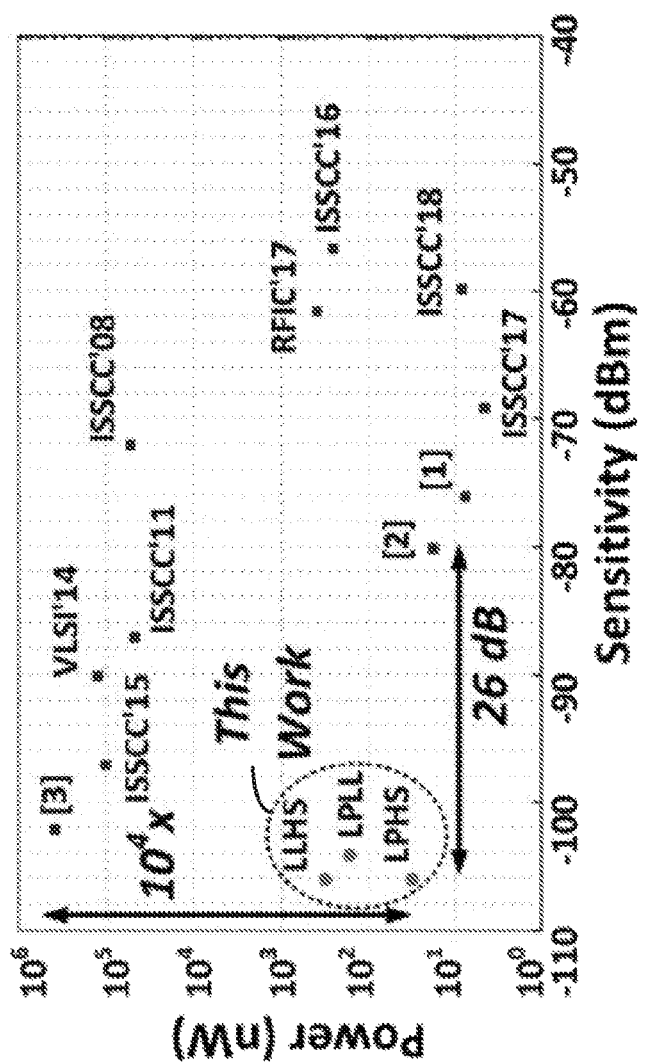
FIG. 8 is a graph illustrating performance characteristics of specific implementations.

At least some of the advantages of a particular implementation of a receiver enabled by the present disclosure may be understood with reference to FIGS. 6-8. The performance depicted in these figures relates to a receiver that includes a CMOS chip fabricated in a standard 65 nm LP process and designed for an RF carrier frequency of 428.3 MHz. Three examples of operating modes characterized by different power levels and different latencies illustrate achievable trade-offs among DC power, latency, and sensitivity. These modes are labeled Low Power, High Sensitivity (LPHS), Low Latency, High Sensitivity (LLHS), and Low Power, Low Latency (LPLL). In this context, latency represents the time required to receive all of the bits of the code.

As shown in FIG. 6, in LPHS mode, the receiver achieves a sensitivity of −106 dBm with a probability of missed detection of $10^{-3}$, 32.7 nW DC power (from a 0.75V VDD), and a latency of 5 seconds with a false code detection rate below 1/hr. The LPLL (240 ms) mode is activated by digitally increasing the BB filter bandwidth and lowering the active time of the RF enable signal. The wide scalability in sensitivity, latency, and DC power consumption is demonstrated by the table of FIG. 6 and the receiver operating characteristic curves of FIG. 7. Overall, tunable ranges of about 9× in DC power, about 20× in latency, and about 3 dB in sensitivity is demonstrated. These performance data show that one receiver design can fulfill an extensive range of design requirements, with implementations enabled by the present disclosure being suitable for operation as, for example, a wakeup receiver or a data receiver. The carrier to interferer ratio (CIR) depicted in FIG. 6 is measured with constant envelope interference of −16 dB at 3 MHz offset and a probability of missed detection of $10^{-2}$.

FIG. 8 illustrates the performance of each of the three operating modes relative to other sub-milliwatt receivers. [1] refers to work reported by J. Moody at the 2018 International Solid-State Circuit Conference (ISSCC). [2] refers to work reported by M. R. Abdelhamid at the 2018 Custom Integrated Circuits Conference (CICC). [3] refers to work reported by N. E. Roberts at the 2015 Radio Frequency Integrated Circuit (RFIC) symposium. ISSCC'08, ISSCC'11, ISSCC'15, ISSCC'16, ISSCC'17, and ISSCC'18 refer to work reported at that conference in the respective years. VLSI'14 refers to work reported at the 2014 VLSI Technology and Circuits Symposia. RFIC'17 refers to work reported at that symposium in 2017. What FIG. 8 illustrates is that a receiver enabled by the present disclosure can achieve 10,000 times lower power than any previous designs characterized by −100 dBm sensitivity. And for previous designs at similar power levels, such a receiver can achieve 26 dB better sensitivity. In addition to those performance benchmarks, latencies of 240 ms have been achieved with latencies under 200 ms being realistically achievable.

FIGS. 6-8 illustrate that at least some implementations of bit-level duty-cycled receivers enabled by the present disclosure are characterized by a broad, three-dimensional range of tunability across varying sensitivity levels, latencies, and power consumptions.

As mentioned above, low-power RF receivers enabled by the present disclosure may be implemented using a triode-mode envelope detector. Two implementations of a triode-mode envelope detector are shown in the schematic diagrams of FIG. 9(a) (a single-ended implementation), and FIG. 9(b) (a pseudo-differential implementation). The depicted implementations may be distinguished from Dickson-type detectors in multiple respects. For example, in the depicted implementations, NMOS and PMOS transistors alternate in a chain, connecting source to source and drain to drain, and the RF input is capacitively coupled to the sources of adjacent transistors in the chain, i.e., the RF input only drives the sources. The drains are connected to ground through capacitors. In contrast, Dickson-type detectors typically use transistors of one type (e.g., NMOS), short the gate to the drain, connect several of these in a chain, and then drive the gate/drain and the source of adjacent transistors with the RF input. Driving only the sources as described herein significantly reduces the parasitic capacitances presented to the RF input because the gate and drain nodes are not also being driven.

Figure 9:
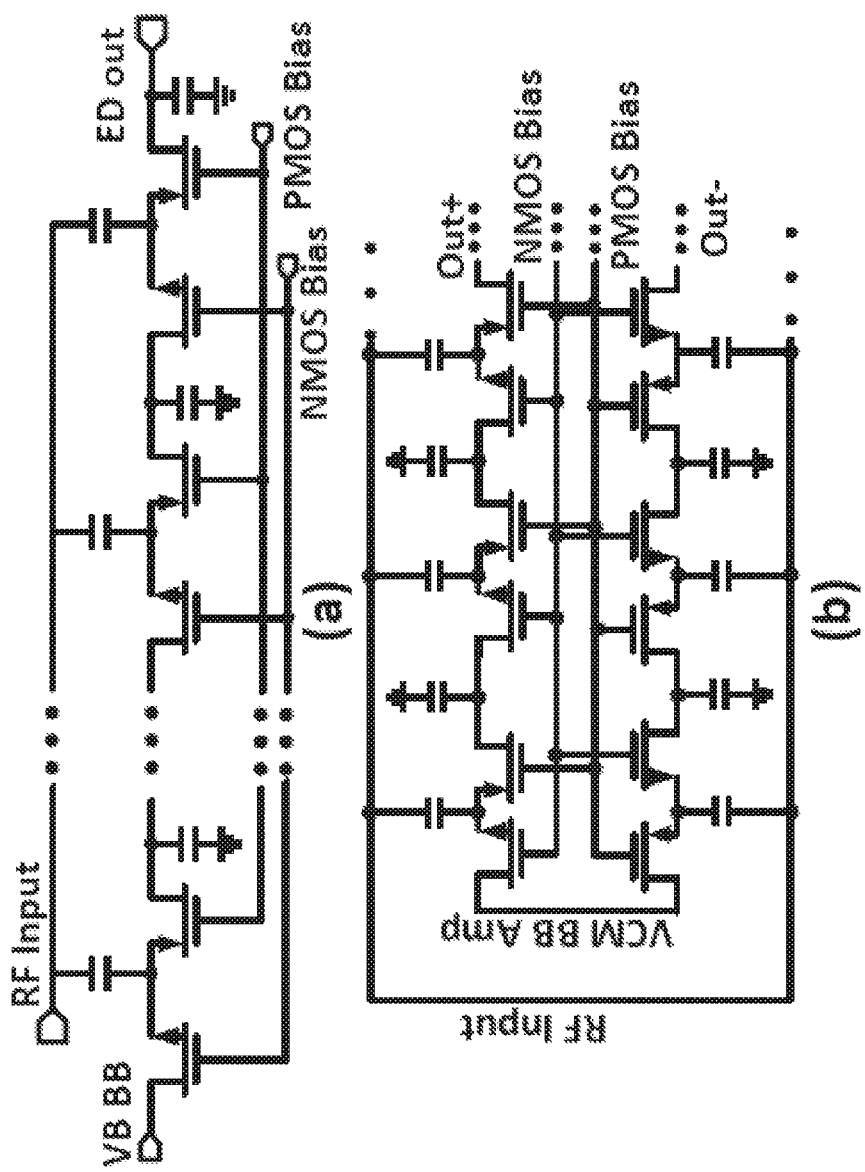
FIGS. 9(*a*) and (*b*) are simplified schematic diagrams illustrating implementations of envelope detectors.

And because the RF input is not present on the gates of the transistors (i.e., because they are not shorted to the corresponding drains or driven with the input signal), an independent bias voltage may be provide on the gates, e.g., one for the NMOS devices and one for the PMOS devices as shown in FIGS. 9(a) and 9(b). Biasing the transistor gates (which includes connecting them to ground) requires little if any power and allows for control of the channel impedances of the transistors. This, in turn, allows for a tradeoff between the input impedance seen at the RF input and how much voltage rectification and/or signal-to-noise ratio can be achieved. If the channel impedance is large, it helps with the input impedance at the expense of making the envelope detector noisier. If the channel impedance is small, it makes it harder to get input impedance matching (and the associated input voltage boost), but improves noise performance In other words, unlike Dickson-type detectors, the triode-mode envelope detectors enabled by the present disclosure are tunable in this way to suit the particular applications in which they are deployed.

The ability to control the channel impedances of the transistors of an envelope detector provides considerable design flexibility relative to previous detector design. For example, the specific semiconductor process technology used to fabricate an integrated circuit is characterized by particular threshold voltages. These result in a very specific transistor channel resistance, imposing a design constraint on what process may be used for a given design and/or what is achievable for a given process. By contrast, the ability to control the transistor channel impedances allows for the optimization of these impedances during and even after the design to suit a specific process and/or application. This optimization may be a one-time adjustment (e.g., during design and fabrication). Alternatively or in addition, the impedances could be dynamically adjusted based on, for example, external environmental factors such as temperature (e.g., by using a simple lookup table to set the biases), interference (e.g., drop impedances lower so you don't saturate the ED), a change in the impedance matching network (e.g., due to changes in antenna impedance). The impedance could also be dynamically adjusted based on internal factors such as, for example, self-heating of the envelope detector circuitry.

A change in antenna impedance may be particularly important for receiver designs in which the envelope detector precedes the RF amplification stage. That is, in addition to the receiver designs discussed herein in which the envelope detector is after the RF amplification stage, implementations of receivers are contemplated in which a triode-mode envelope detector precedes the RF amplification. Given that the antenna impedance presented to the input of the envelope detector in such designs may change significantly, the ability to tune the channel impedances of the detector could be leveraged to mitigate the effects of this.

The ability to control the channel impedance may also result in an envelope detector with superior sensitivity as compared to a conventional Dickson-type detector. That is, it is known that the optimum sensitivity of an envelope detector is achieved when the ratio of the channel impedance to the number of detector stages is equal to the source impedance, implying that fine control of the channel impedances of a detector is beneficial for detector performance. But the fixed channel impedances of previous designs and the channel impedance ranges by which modern fabrication processes are characterized represent severe constraints on achieving such detector performance. By contrast, utilization of the gate bias in triode-mode envelope detectors enabled by the present disclosure allows for the tunability of the channel impedance and thereby the optimization of detector performance in this regard.

In some implementations, off-chip reactive matching is utilized in a receiver to provide higher voltage boosting to the RF front end allowing for an improved receiver noise figure. This can take the form of, for example, lumped LC matching, distributed element matching, MEMS matching (e.g., using a MEMs transformer), or antenna matching. A variety of different matching networks may be used. For example, the implementation shown in FIG. 3 uses a lumped LC matching network with a tunable capacitor.

In addition to its use in a low-power receiver, a triode-mode envelope detector enabled by the present disclosure may be suitable for a variety of other applications including, for example, RF energy harvesting, spectrum usage detection, and sensor front ends for time-varying sensor signals. The scope of the present disclosure in relation to triode-mode envelope detectors should therefore not be limited by reference to specific implementations and applications described herein.

Figure 10:
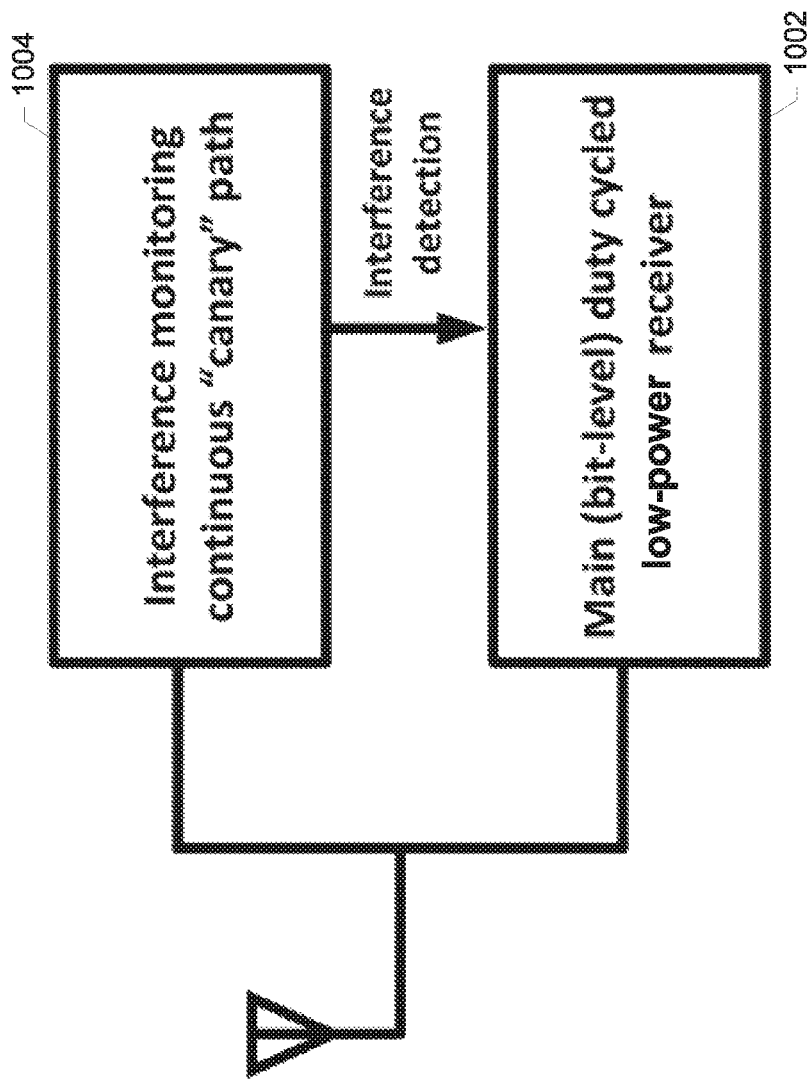
FIG. 10 is a simplified block diagram in which an additional receiver is configured in parallel with a main receiver.

According to a particular implementation illustrated in FIG. 10, a duty-cycled receiver 1002 implemented as described herein may have a separate receiver 1004 in parallel. Receiver 1004 may be an extremely low-power receiver (e.g., 5 to 10 nanowatts) that has an envelope-detector-first topology, and is configured to monitor for interference and adjust parameters of receiver 1002 in the presence of strong interference. This approach addresses concerns about overwhelming the RF front end of receiver 1002 given that its envelope detector is after the RF gain stage. That is, an ED-first receiver can have a much wider dynamic range for input signals at the cost of sensitivity. By contrast, designs enabled by the present disclosure are characterized by superior performance in terms of sensitivity, but are potentially vulnerable to strong interference. Using the approach illustrated in FIG. 10, if strong interference is detected, receiver 1004 can detect this and send a message to receiver 1002 to lower the gain on its RF amplifier so that it doesn't saturate.

Figure 11A:
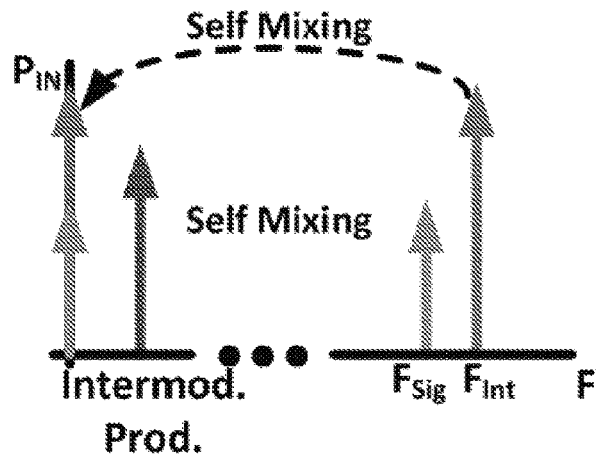
FIGS. 11A, 11B, and 11C illustrate different code modulation techniques that may be employed with various implementations.
Figure 11B:
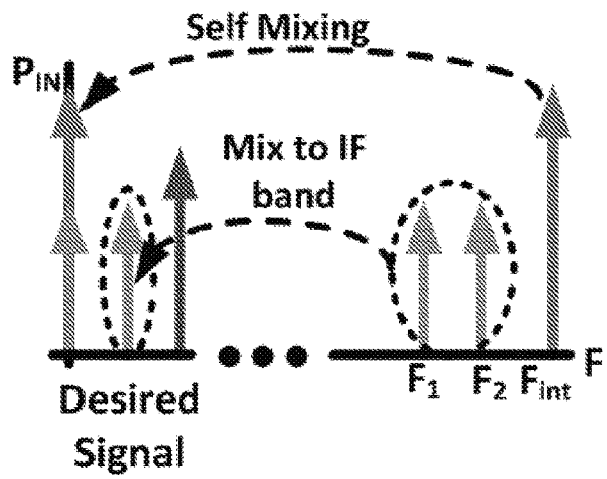

According to some implementations, interference rejection for a receiver may be improved using multi-tone modulation techniques. That is, while implementations are contemplated that employ single-tone on-off-keying (OOK) modulation (e.g., see FIG. 11A), other implementations are contemplated in which multiple tones at different frequencies are used to transmit the code to the receiver. In one example illustrated in FIG. 11B, two OOK tone signals spaced slightly apart from each other in frequency are used to transmit the code to the receiver. When the two tones are down-converted by the receiver's envelope detector, instead of getting down-converted to a DC tone, they get down-converted to the frequency difference between the two tones. This allows for much better filtering at the baseband. That is, by sending F1 and F2 that allows for a bandpass filter that rejects the interfering and intermodulation signals.

Figure 11C:
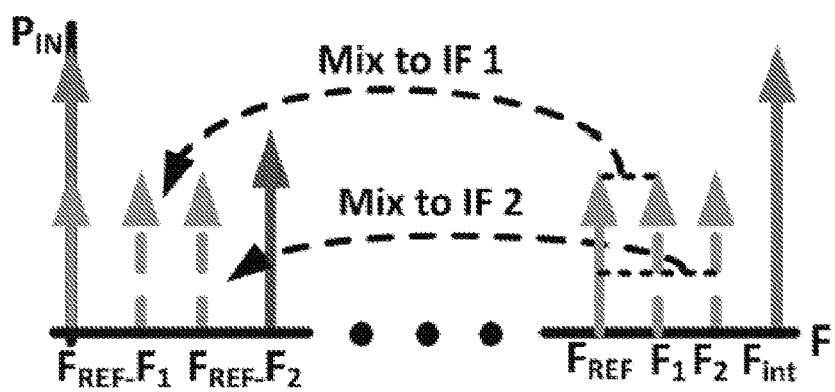

In another example, three-tone modulation is used and the transmitted tones are received with no local reference. As shown in FIG. 11C, a reference is transmitted followed by a set of tones at differing frequency offsets to emulate frequency-shift-keying (FSK) transmission without a local oscillator in the receiver. This approach may be used to both increase the data rate and improve interference robustness. Instead of detecting whether two tones are on or off, this approach switches from a two-tone signal with a 50 kHz separation to a two-tone signal with a 75 kHz separation, and detects the difference in frequency at IF. In this approach, Fref is always sent along with either F1 or F2, i.e., only two of the three frequencies are sent at once. This results in a kind of FSK modulation at the baseband which allows for further interference rejection.

It will be understood by those skilled in the art that changes in the form and details of the implementations described herein may be made without departing from the scope of this disclosure. In addition, although various advantages, aspects, and objects have been described with reference to various implementations, the scope of this disclosure should not be limited by reference to such advantages, aspects, and objects. Rather, the scope of this disclosure should be determined with reference to the appended claims.

What is claimed is:

1. A radio frequency (RF) receiver, comprising:
an RF gain stage configured to amplify an RF signal, the RF signal being characterized by a bit duration;
an envelope detector following the RF gain stage;
baseband circuitry following the envelope detector, the baseband circuitry being configured to detect a modulating signal transmitted with the RF signal; and
enable circuitry configured to enable the RF gain stage to sample the RF signal using a sampling duration, wherein the sampling duration is configurable down to less than 10% of the bit duration.

2. The RF receiver of claim 1, wherein the RF gain stage includes a regenerative ring amplifier, the regenerative ring amplifier employing feedback that does not include inductive components.

3. The RF receiver of claim 2, wherein the feedback includes a tunable capacitor configured to maintain operation of the regenerative ring amplifier near an instability point.

4. The RF receiver of claim 3, wherein the tunable capacitor is fixed during operation of the RF receiver.

5. The RF receiver of claim 3, wherein the tunable capacitor is dynamically tunable during operation of the RF receiver.

6. The RF receiver of claim 5, wherein the tunable capacitor is dynamically tunable during the sampling duration.

7. The RF receiver of claim 1, further comprising auxiliary receiver circuitry configured to receive the RF signal and to adjust one or more parameters of the RF receiver in response to detection of RF interference.

8. The RF receiver of claim 7, wherein the auxiliary receiver circuitry includes a second RF gain stage and a second envelope detector preceding the second RF gain stage.

9. The RF receiver of claim 1, further comprising a high-Q filter following the RF gain stage and preceding the envelope detector.

10. The RF receiver of claim 9, wherein the high-Q filter includes a micro-electromechanical component.

11. The RF receiver of claim 9, wherein the RF gain stage, the envelope detector, and the enable circuitry are implemented in one or more integrated circuits, and wherein the high-Q filter is implemented with one or more discrete components separate from the one or more integrated circuits.

12. The RF receiver of claim 1, wherein the enable circuitry is also configured to enable the baseband circuitry before enabling the RF gain stage.

13. The RF receiver of claim 12, wherein the enable circuitry is configured to enable different parts of the baseband circuitry at different times.

14. The RF receiver of claim 1, further comprising a high-Q filter preceding the RF gain stage.

15. The RF receiver of claim 1, further comprising an impedance matching network preceding the RF gain stage.

16. The RF receiver of claim 1, wherein the enable circuitry is configured to enable the RF gain stage to sample the RF signal multiple times during the bit duration.

17. The RF receiver of claim 1, wherein the sampling duration is configurable down to less than 1% of the bit duration.

18. The RF receiver of claim 1, wherein the envelope detector is a triode-mode envelope detector.

19. The RF receiver of claim 18, wherein the triode-mode envelope detector includes a plurality of N-type transistors and a plurality of P-type transistors, the N-type transistors and P-type transistors being configured in a plurality of stages, each stage including an N-type transistor and a P-type transistor connected to each other at corresponding source terminals and capacitively coupled to ground at corresponding drain terminals, the N-type transistor in each stage including a gate terminal configured to receive a first bias voltage, the P-type transistor in each stage including a gate terminal configured to receive a second bias voltage, wherein the connected source terminals of each stage are configured to receive a radio frequency (RF) input signal, wherein the first bias voltage controls a channel impedance for each of the N-type transistors, and wherein the second bias voltage controls a channel impedance for each of the P-type transistors.

20. The RF receiver of claim 1, further comprising control circuitry configured to control gain of one or more gain components of the baseband circuitry and to control a dynamic range associated with one or more detection components of the baseband circuitry.

21. The RF receiver of claim 20, wherein the one or more detection components of the baseband circuitry include a first comparator configured to detect bits transmitted with the RF signal, and wherein the control circuitry is configured to control the dynamic range by adjusting a comparator threshold associated with the first comparator.

22. The RF receiver of claim 21, wherein the one or more detection components of the baseband circuitry include a second comparator and a third comparator, the second and third comparator being configured to generate range signals representing an amplified signal level of the envelope detector in relation to the dynamic range, and wherein the control circuitry is configured to control the dynamic range based on the range signals.

23. The RF receiver of claim 20, wherein the one or more detection components of the baseband circuitry include an analog-to-digital converter (ADC) configured to detect bits transmitted with the RF signal.

24. The RF receiver of claim 1, wherein the modulating signal transmitted with the RF signal is represented by a sequence of bits, each bit being represented using a first tone at a first frequency and a second tone at a second frequency, and wherein the baseband circuitry includes a bandpass filter configured to reject interfering signals.

25. The RF receiver of claim 1, wherein the modulating signal transmitted with the RF signal is represented by a sequence of bits, each bit being represented using a reference tone at a reference frequency and either a first tone at a first frequency or a second tone at a second frequency, the first and second tones being used alternately in conjunction with the reference tone to represent successive bits, and wherein the baseband circuitry includes a bandpass filter configured to reject interfering signals.

26. The RF receiver of claim 25, wherein the baseband circuitry is configured to detect the sequence of bits without a local oscillator.

27. An envelope detector, comprising a plurality of N-type transistors and a plurality of P-type transistors, the N-type transistors and P-type transistors being configured in a plurality of stages, each stage including an N-type transistor and a P-type transistor connected to each other at corresponding source terminals and capacitively coupled to ground at corresponding drain terminals, the N-type transistor in each stage including a gate terminal configured to receive a first bias voltage, the P-type transistor in each stage including a gate terminal configured to receive a second bias voltage, wherein the connected source terminals of each stage are configured to receive a radio frequency (RF) input signal, wherein the first bias voltage controls a channel impedance for each of the N-type transistors, and wherein the second bias voltage controls a channel impedance for each of the P-type transistors.

28. The envelope detector of claim 27, wherein the first and second bias voltages are fixed during operation of the envelope detector.

29. The envelope detector of claim 27, wherein the first and second bias voltages are dynamically controllable during operation of the envelope detector.

30. The envelope detector of claim 29, wherein the first and second bias voltages are dynamically controllable in response to one or more of temperature, RF interference, matching network impedance, or antenna impedance.

31. The envelope detector of claim 30, wherein the first and second bias voltages are dynamically controllable using a lookup table stored in memory associated with the envelope detector.

* * * * *